US012197831B1

(12) United States Patent
Feng et al.

(10) Patent No.: US 12,197,831 B1
(45) Date of Patent: Jan. 14, 2025

(54) GROUND MOTION INTENSITY MEASURE OPTIMIZATION METHOD FOR SEISMIC RESPONSE PREDICTION

(71) Applicant: Southeast University, Jiangsu (CN)

(72) Inventors: Decheng Feng, Jiangsu (CN); Jiayi Ding, Jiangsu (CN); Xuyang Cao, Jiangsu (CN); Shizhi Chen, Jiangsu (CN); Gang Wu, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 18/739,249

(22) Filed: Jun. 10, 2024

(30) Foreign Application Priority Data

Nov. 20, 2023 (CN) ......................... 202311544897.X

(51) Int. Cl.
*G06F 30/27* (2020.01)
(52) U.S. Cl.
CPC ................... *G06F 30/27* (2020.01)
(58) Field of Classification Search
USPC ........................................................... 703/2
See application file for complete search history.

(56) References Cited

U.S. PATENT DOCUMENTS

2020/0025957 A1* 1/2020 Guo ......................... E04H 9/02

FOREIGN PATENT DOCUMENTS

CN 109359311 2/2019

OTHER PUBLICATIONS

Chen, Libo et al., "Comparison and selection of ground motion intensity measures in probabilistic seismic demand analysis", Journal of Earthquake Engineering and Engineering Vibration, vol. 32, No. 6, Dec. 15, 2012, with English abstract thereof, pp. 23-31.
Wentao Wang et al., "Machine learning-based collapse prediction for post-earthquake damaged RC columns under subsequent earthquakes", Soil Dynamics and Earthquake Engineering, vol. 172, May 26, 2023, pp. 1-16.

* cited by examiner

*Primary Examiner* — Bryce M Aisaka
(74) *Attorney, Agent, or Firm* — JCIPRNET

(57) ABSTRACT

The invention discloses a ground motion intensity measure optimization method for seismic response prediction. The method includes the following steps: (1) building a building damage database; (2) optimizing ground motion intensity measures; (3) constructing a machine learning model; and (4) predicting damage states. According to the method, a combination of optimal ground motion intensity measures is selected by an elastic-net algorithm, wherein the efficiency and practicability in a current selection criterion are updated based on the goodness of fit and regression coefficient of the elastic-net model, thereby avoiding an assumption that intensity measures and structure response need to obey a logarithmic linear relationship and the limitation of intensity measure dimensions in traditional methods. By using the combination of optimal ground motion intensity measures as input variables, the prediction accuracy can be remarkably improved, and meanwhile the number of samples required is reduced.

6 Claims, 5 Drawing Sheets

GROUND MOTION INTENSITY MEASURE OPTIMIZATION METHOD FOR SEISMIC RESPONSE PREDICTION

CROSS-REFERENCE TO RELATED APPLICATION

This application claims the priority benefit of China application serial no. 202311544897.X, filed on Nov. 20, 2023. The entirety of the above-mentioned patent application is hereby incorporated by reference herein and made a part of this specification.

BACKGROUND OF THE INVENTION

1. Technical Field

The invention relates to the technical field of seismic performance evaluation of buildings and, in particular, to a ground motion intensity measure optimization method for seismic response prediction.

2. Description of Related Art

The safety of buildings is a key issue in the advancement of urbanization in China, due to frequent earthquake disasters. Once a building structure is damaged, it can cause significant economic losses and even casualties. Therefore, there is an urgent need to develop a reliable and rapid seismic damage assessment method for buildings to provide technical support for post-earthquake emergency management decisions. Machine learning-based seismic damage prediction of buildings, with high accuracy and greatly shortens the assessment time, is the future development direction of design and risk assessment management for urban buildings. Although the machine learning model is not mathematically limited by the dimensions of ground motion intensity measures, it is still very important to optimize intensity measures. On the one hand, considering the complexity of ground motions, numerous intensity measures are needed to characterize the features of ground shaking, so as to train practical machine learning models to predict the complex response of buildings during strong earthquake events. On the other hand, considering numerous intensity measures as input variables will lead to a high-dimensional probability space mapping problem, it requires a large number of samples to train machine learning models, and even the models cannot be accurately constructed. Existing ground motion intensity measure optimization methods often focus on a single intensity measure, and rely on an assumption that intensity measures and structural demand parameters exhibit a logarithmic linear correlation. However, structural damage often exhibits inelastic behaviors, and especially for complex high-rise buildings, it greatly limits the applicability of traditional ground motion intensity optimization methods. Therefore, by making full use of the advantages of data drive, a combination of ground motion intensity measures that are closely related to the responses of buildings are selected to improve the construction efficiency and prediction accuracy of machine learning models.

BRIEF SUMMARY OF THE INVENTION

Objectives of the invention: An objective of the invention is to provide a ground motion intensity measure optimization method for seismic response prediction, which avoids the assumption of logarithmic linearity in traditional methods and the limitation of intensity measure dimensions. The method can be performed by a computer including a processor and a memory. The memory stores instructions which are executed by the processor to perform the method.

Technical solution: The ground motion intensity measure optimization method for seismic response prediction according to the invention comprises the following steps:

(1) determining candidate intensity measures IMs by the collection and sorting of literature, obtaining N actual ground motion records that match the site-specific target response spectrum, and calculating candidate intensity measures corresponding to each ground motion record;

(2) determining structural parameters SPs of a building and probability distribution, and carrying out Latin Hypercube Sampling (LHS) to obtain N building samples that meet probability distribution of these parameters;

(3) using OpenSees software to establish N numerical models of the building corresponding to the parameter samples, and obtaining N damage measures DMs of the building by nonlinear time-history analysis to build a post-earthquake building damage database;

(4) constructing a variable selection model based on an elastic-net algorithm according to the post-earthquake building damage database;

(5) calculating the efficiency and practicality of input variables based on the elastic-net model, then selecting a combination of optimal intensity measures IMs*, and testing the adequacy of the intensity measures;

(6) based on the post-earthquake building damage database, training and testing a machine learning model to calculate the score of the model's prediction performance;

(7) based on the score of prediction performance, determining optimal hyperparameters by the grid search technique and the corresponding machine learning models; and (8) rapidly predicting a structural damage state of the building under earthquake excitation by the trained machine learning models.

Further, in step (1), the candidate ground motion intensity measures IMs are divided into structure-independent or structure-dependent related to acceleration, related to velocity, related to displacement, and related to time based on their physical definition; according to the fortification level, site condition and design characteristic period, actual ground motion records that match the site-specific target response spectrum are obtained.

Further, in an embodiment, in step (2), there are 12 structural parameters SPs of the building, including: bulk density of concrete, compressive strength of core concrete, peak strain of core concrete, ultimate strain of core concrete, compressive strength of cover concrete, ultimate strain of cover concrete, diameter of steel bars in columns, diameter of $\Phi 20$ steel bars in beams, diameter of $\Phi 18$ steel bars in beams, yield strength of steel bars, elastic modulus of steel bars, and hardening rate of steel bars; the probability distribution parameters include mean, variance and distribution type, and then 12 structural parameter variables are sampled respectively by LHS to generate N random samples, which are finally combined into N pieces of building sample data.

Further, in step (3), the N numerical models of the building are randomly matched with N ground motion records; the damage measures DM of the building refer to a maximum inter-story drift ratio.

Further, the post-earthquake building damage database in step (3) is built by: using the ground motion intensity measures and the structural parameters of the building as input samples; and the damage measures of the building as output samples.

Further, in an embodiment, step 4 is implemented as follows:

first, N ground motion intensity measures $x_{IMs}=[x_1, x_2, \ldots, x_n]$ in the database are input samples, where n is the number of candidate intensity measure; output samples are the corresponding N damage measures $y_{DM}$;

then, the database is standardized and then randomly divided into a training set and a test set according to a P:Q ratio; the elastic-net algorithm is expressed as:

$$\hat{\beta} = \arg\min_{\beta}\left(\sum_{i=1}^{N}\left(y_i - \sum_{j=1}^{n}x_{ij}\beta_j\right)^2 + \alpha\lambda\sum_{j=1}^{n}|\beta_j| + \frac{(1-\alpha)}{2}\lambda\sum_{j=1}^{n}|\beta_j|^2\right)$$

where $\beta=[\beta_1, \beta_2, \ldots, \beta_n]$ refers to a regression coefficient; $\alpha \in [0, 1]$ refers to a hyperparameter; $\lambda$ refers to a non-negative regularization parameter; $\alpha$ and $\lambda$ are determined by the following criteria:

(a) when $\alpha$ tends to 1, the elastic-net algorithm, similar to a Lasso algorithm, causes too many input features to be screened out, resulting in unstable models; and when $\alpha$ tends to 0, redundant input features are retained, resulting in a lack of selection efficiency;

(b) when $\lambda$ is larger, the regression coefficients of more variables are reduced to 0, that is, the variables are screened out.

Further, in step (5), the efficiency of an intensity measure is represented by the goodness of fit ($R^2$) of the elastic-net model, which is calculated by:

$$R^2 = 1 - \frac{\sum_{i=1}^{N}(y_i - \hat{y}_i)^2}{\sum_{i=1}^{N}\left(y_i - \frac{1}{N}\sum_{i=1}^{N}y_i\right)^2}$$

where y and $\hat{y}$ are a true value and a predicted value, respectively.

The practicality of an intensity measure is represented by a variable regression coefficient $\beta$ of the elastic-net model; a linear regression model over each intensity measure and a corresponding damage measure of the building is constructed to obtain a relative error (i.e., residual) between the predicted value and the true value; the adequacy of the intensity measure is characterized according to a significance test between the corresponding residual of the intensity measure and seismic characteristics (i.e., magnitude and rupture distance). It is generally believed that when the p-value of the significance test level is greater than 0.05, the intensity measure meets the adequacy requirement.

Further, the machine learning method in step (6) includes K nearest neighbor (KNN), Gaussian process regression (GPR), support vector machine (SVM), artificial neural network (ANN), random forest tree (RF) and extreme gradient boosting tree (XGBoost).

Further, in step (6), the input samples of the database are $x=[x_{IMs}*, x_{SPs}]$, including the optimal ground motion intensity measures and the structural parameters, and the output samples are damage measures $y_{DM}$ of the building.

the database is standardized and then randomly divided into a training set and a test set according to a P:Q ratio for training.

Further, in step (7), mean square error (MSE) is used as an assessment measure to determine the optimal hyperparameters of the machine learning models as follows:

$$MSE = \frac{1}{N}\sum_{i=1}^{N}(y_i - \hat{y}_i)^2$$

where y and $\hat{y}$ are a true value and a predicted value, respectively.

The goodness of fit ($R^2$) and the root mean square error (RMSE) of the test set are used to demonstrate the prediction performance of the machine learning models, wherein the RMSE is calculated by:

$$RMSE = \left(\frac{1}{N}\sum_{i=1}^{N}(y_i - \hat{y}_i)^2\right)^{1/2}$$

where y and $\hat{y}$ are a true value and a predicted value, respectively.

Beneficial effects: Compared with the prior art, the invention has the following significant advantages: based on a damage database of the buildings under strong earthquake excitations, a combination of optimal ground motion intensity measures is selected by an elastic-net technology, avoiding the assumption of logarithmic linearity in traditional methods and the limitation of intensity measure dimensions. Using the optimal ground motion intensity measures as input can significantly improve the prediction accuracy of the machine learning models as compared with using a single intensity measure as input, and can greatly reduce the number of samples required for training as compared with using all candidate intensity measures as input. The application of the invention can be easily extended to the rapid prediction of post-earthquake damage states of bridges, dams, tunnels and other structures.

DETAILED DESCRIPTION OF THE INVENTION

The technical solution of the invention is further described below in conjunction with the accompanying drawings.

Figure 1:
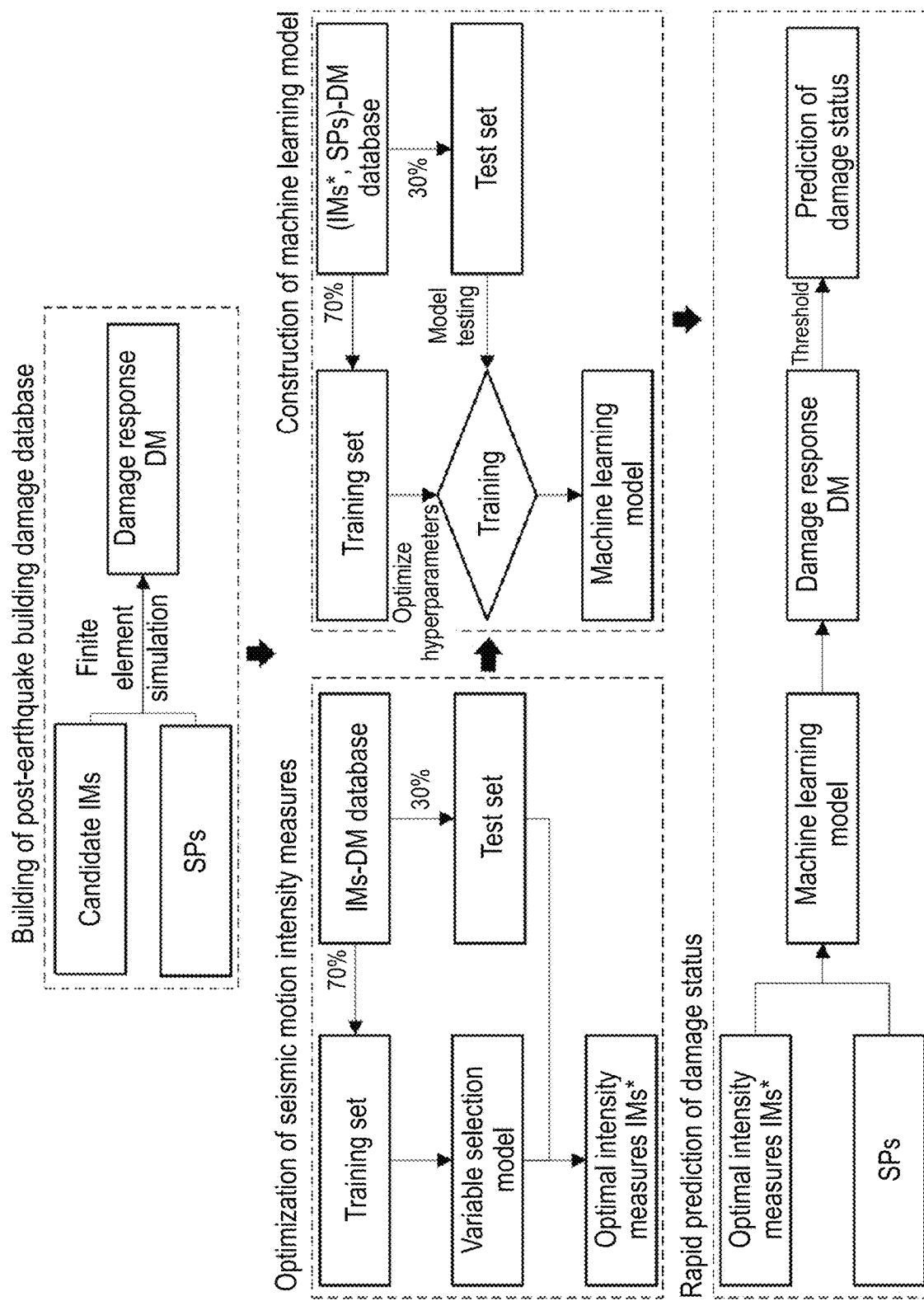
FIG. 1 is a flowchart of the invention.
Figure 2:
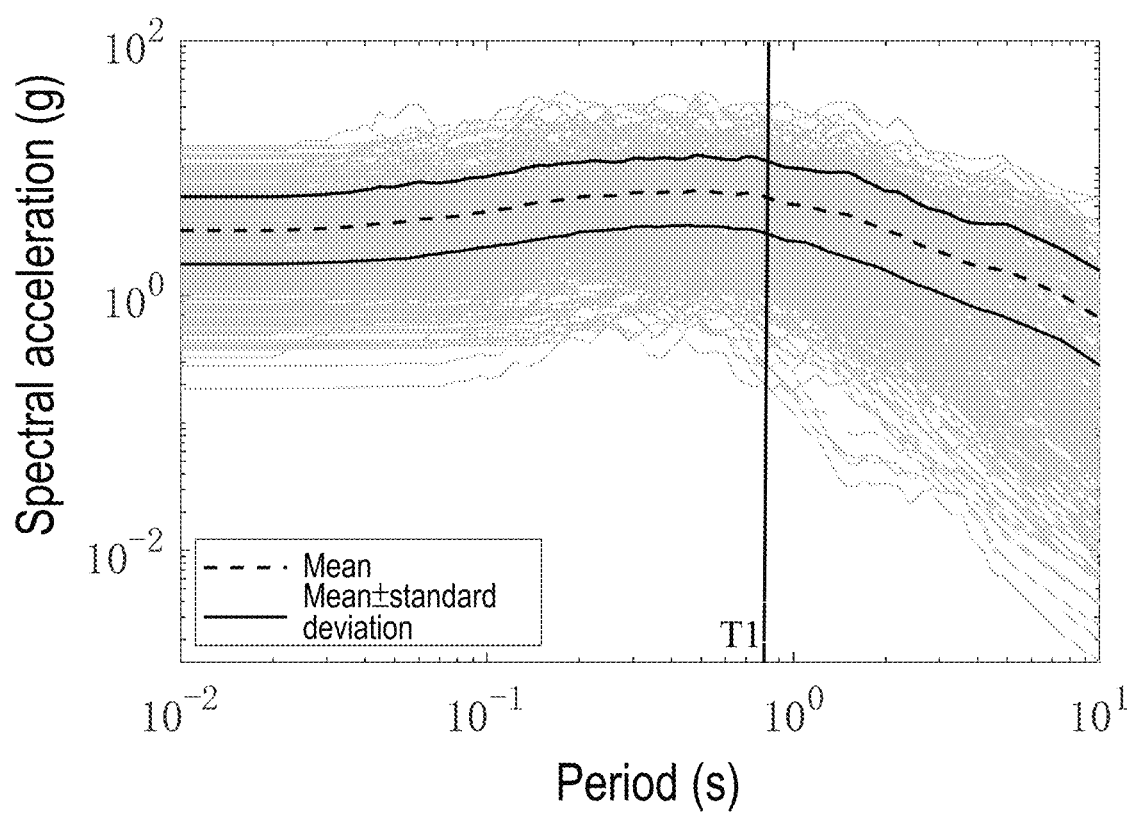
FIG. 2 is an acceleration response spectrum of ground motion records according to the invention.

Referring to FIG. 1, an embodiment of the invention provides a ground motion intensity measure optimization method for seismic response prediction, comprising the following steps:

(1) Determining candidate intensity measures IMs by the collection and sorting of literature, obtaining N actual ground motion records that match the site-specific target response spectrum, and calculating candidate intensity measures corresponding to each ground motion record. In an embodiment, according to the site design requirements (i.e., fortification level, site condition, and design characteristic period) of a study area, 320 ground motion records are selected from an earthquake database of the Pacific Earthquake Engineering Research Center, and the acceleration response spectrum of the ground motion records are shown in FIG. 2. The candidate intensity measures IMs in Table 1 are determined by the collection and sorting of literature, and 28 candidate intensity measures corresponding to each ground motion record are calculated.

TABLE 1

Candidate ground motion intensity measures

| No. | Intensity measure | Description |
|---|---|---|
| 1 | PGA | Peak ground acceleration |
| 2 | SMA | Sustained maximum acceleration |
| 3 | CAV | Cumulative absolute velocity |
| 4 | Arms | Acceleration root mean square |
| 5 | Ia | Arias intensity |
| 6 | Ic | Characteristic intensity |
| 7 | EDA | Effective design acceleration |
| 8 | PGV | Peak ground velocity |
| 9 | SMV | Sustained maximum velocity |
| 10 | CAD | Cumulative absolute displacement |
| 11 | Vrms | Velocity root mean square |
| 12 | SED | Specific energy density |
| 13 | FI | Fajfar intensity |
| 14 | PGD | Peak ground displacement |
| 15 | Drms | Displacement root mean square |
| 16 | SD | Significant duration |
| 17 | Varatio | Velocity-acceleration ratio |
| 18 | ASI | Acceleration spectrum intensity |
| 19 | EPA | Effective peak acceleration |
| 20 | $Sa\text{-}T_1$ | Spectral acceleration at $T_1$ |
| 21 | Sa-0.2s | Spectral acceleration at 0.2 s |
| 22 | Sa-1.0s | Spectral acceleration at 1.0 s |
| 23 | Sa-2.0s | Spectral acceleration at 2.0 s |
| 24 | Sa-avg | Average spectral acceleration |
| 25 | VSI | Velocity spectrum intensity |
| 26 | HI | Housner intensity |
| 27 | $Sv\text{-}T_i$ | Spectral velocity at $T_i$ |
| 28 | $Sd\text{-}T_1$ | Spectral displacement at $T_1$ |

(2) Determining structural parameters SPs of a building and probability distribution, and carrying out Latin Hypercube Sampling (LHS) to obtain N building samples that meet parameter probability distribution. In an embodiment, taking a concrete frame shown in FIG. 3 as a study example, based on field and literature research, the structural parameters of the building and the probability distribution (such as mean, standard deviation, distribution type) of these parameters are determined. 12 structural parameter variables are respectively sampled by LHS to generate 320 random number samples, thereby obtaining 320 pieces of building samples.

TABLE 2

Structural parameters, and probability distribution of the concrete frame building

| Structural parameter | Mean | Standard deviation | Distribution type |
|---|---|---|---|
| Bulk density of concrete | 26.5 (kN/m³) | 1.8497 | Normal |
| Compressive strength of core concrete | 26.8 (MPa) | 4.824 | Lognormal |
| Peak strain of core concrete | $2.5 \times 10^{-3}$ | $3.75 \times 10^{-4}$ | Lognormal |
| Ultimate strain of core concrete | $2 \times 10^{-2}$ | $1.04 \times 10^{-2}$ | Lognormal |
| Compressive strength of cover concrete | 20 (MPa) | 3.6 | Lognormal |
| Ultimate strain of cover concrete | 0.001 | 0.002 | Lognormal |
| Diameter of steel bars in columns, | 25 (mm) | 1 | Normal |
| Diameter of @20 steel bars in beams | 20 (mm) | 0.8 | Normal |
| Diameter of @18 steel bars in beams | 18 (mm) | 0.72 | Normal |
| Yield strength of steel bars | 378 (MPa) | 27.972 | Lognormal |
| Elastic modulus of steel bars | $2.01 \times 10^3$ (kMPa) | $6.633 \times 10^3$ | Lognormal |
| Hardening rate of steel bars | $2 \times 10^{-2}$ | $4 \times 10^{-3}$ | Lognormal |

Figure 3:
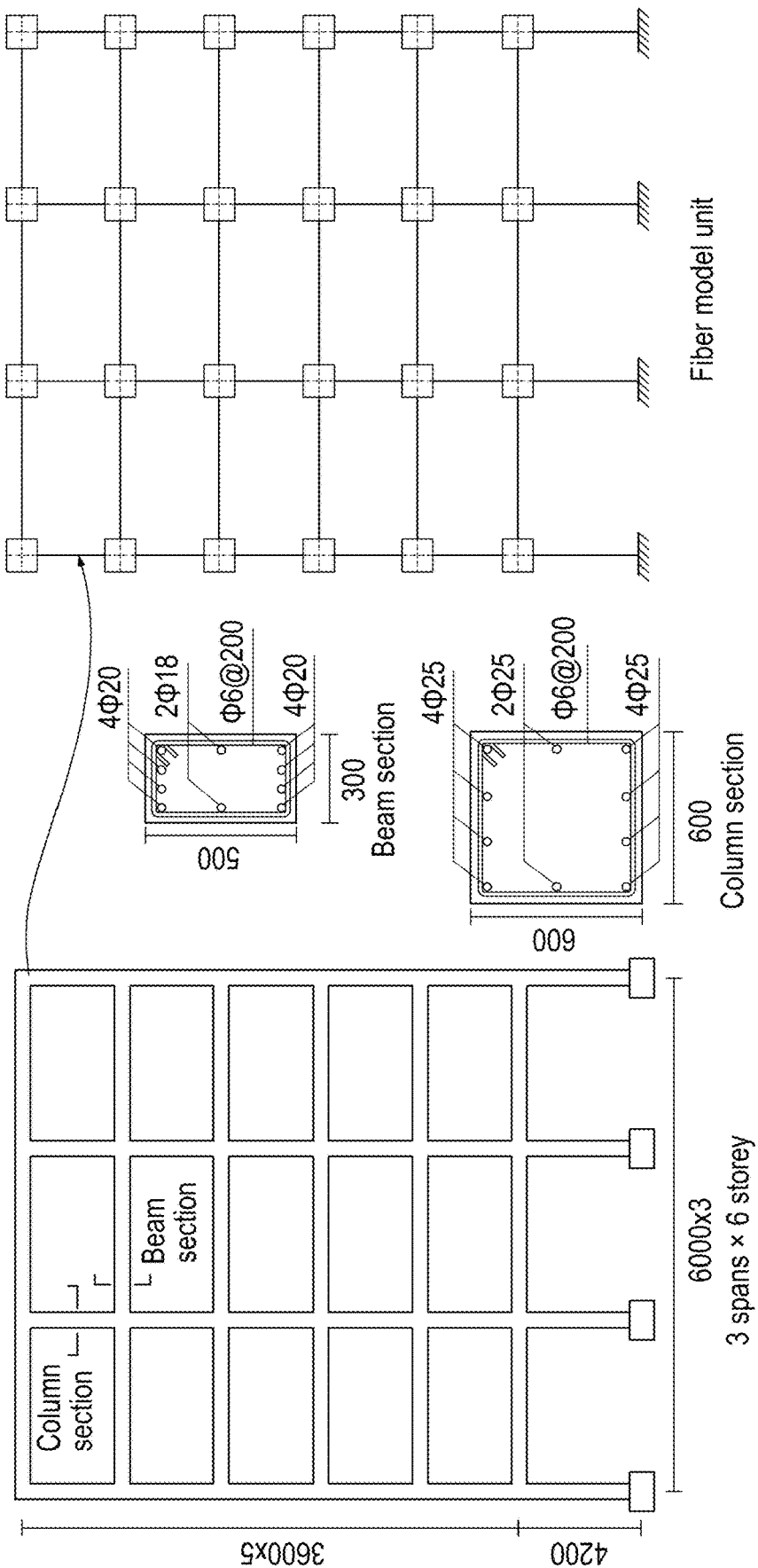
FIG. 3 is a schematic diagram of a numerical model of a building frame according to the invention.

(3) Using OpenSees software to establish 320 numerical models of the building corresponding to the building samples and obtaining N damage measures DMs of the building by nonlinear time-history analysis to build a post-earthquake building damage database. In an embodiment, a finite element model is established by means of OpenSees software, as shown in FIG. 3; and then the nonlinear damage response of the building model over 320 ground motion records are calculated.

(4) Constructing a variable selection model based on the elastic-net algorithm according to the post-earthquake building damage database. In an embodiment:

first, 320 ground motion intensity measures are used as input samples $x_{IMs}$ and the corresponding building damage responses are used as output samples $y_{DM}$;

then, the database is standardized to avoid the influence of the units and ranges of the intensity measures, and then the database is randomly divided into a training set and a test set according to a ratio of 7:3; the elastic-net algorithm is expressed as:

$$\hat{\beta} = \arg\min_{\beta} \left( \sum_{i=1}^{N} \left( y_i - \sum_{j=1}^{n} x_{ij} \beta_j \right)^2 + \alpha \lambda \sum_{j=1}^{n} |\beta_j| + \frac{(1-\alpha)}{2} \lambda \sum_{j=1}^{n} |\beta_j|^2 \right)$$

where $\beta = [\beta_1, \beta_2, \ldots, \beta_n]$ refers to a regression coefficient; $\alpha \in [0, 1]$ refers to a hyperparameter; $\lambda$ refers to a non-negative regularization parameter; α and λ are determined by the following criteria:
  (a) when α tends to 1, the elastic-net algorithm, similar to a Lasso algorithm, causes too many input features to be screened out, resulting in unstable models; and when α tends to 0, redundant input features are retained, resulting in a lack of selection efficiency;
  (b) when λ is larger, the regression coefficients of more variables are reduced to 0, that is, the variables are screened out.

(5) Calculating the efficiency and practicality of input variables by means of an elastic-net model, then selecting a combination of optimal intensity measures IMs*, and testing the adequacy of the intensity measures. In an embodiment, the hyperparameter λ for the elastic-net algorithm is determined according to the goodness of fit ($R^2$) of the test set to ensure the efficiency of optimal intensity measure selection. $R^2$ is calculated by:

$$R^2 = 1 - \frac{\sum_{i=1}^{N}(y_i - \hat{y}_i)^2}{\sum_{i=1}^{N}\left(y_i - \frac{1}{N}\sum_{i=1}^{N}y_i\right)^2}$$

where $y$ and $\hat{y}$ are a true value and a predicted value, respectively.

The practicality of an intensity measure is assessed according to the regression coefficient corresponding to the intensity measure. A linear regression model over each intensity measure and a corresponding damage measure of the building is constructed to obtain a relative error (i.e., residual) between the predicted value and the true value of the damage measure; the p-value of the significance test level between the corresponding residual of the intensity measure and seismic characteristics (i.e., seismic magnitude and seismic distance) is calculated. intensity measures with p-values less than or equal to 0.05 are screened out to meet the adequacy requirement. Table 3 lists the combination of optimal ground motion intensity measures and the practical ranking of the ground motion intensity measures.

TABLE 3

The combination of optimal ground motion intensity measures

| Intensity measure | Sa-1.0s | VSI | HI | Sa-avg | PGV | SMV | Sa-T$_1$ | I$_c$ |
|---|---|---|---|---|---|---|---|---|
| Regression coefficient β × 10$^{-2}$ | 0.218 | 0.144 | 0.140 | 0.056 | 0.055 | 0.052 | 0.041 | 0.035 |
| Ranking | 1 | 2 | 3 | 4 | 5 | 6 | 7 | 8 |

(6) Based on the post-earthquake building damage database, performing model training by means of a machine learning method to obtain prediction accuracy measures. In an embodiment, Taking the combination of 320 optimal ground motion intensity measures $x_{IMs}$* and corresponding structural parameters $x_{SPs}$ of the building as input samples, and the corresponding damage measures $y_{DM}$ of the building as output samples, the database is randomly divided into a training set and a test set according to a ratio of 7:3. Based on the training set, KNN, GPR, SVM, ANN, RF and XGBoost are used for model training respectively. The optimal values of the key hyperparameters listed in Table 4 are determined by grid search technique to obtain a most accurate machine learning prediction model.

TABLE 4

Key hyperparameters of various machine learning methods

| Machine learning method | Main hyperparameter |
|---|---|
| KNN | Number of neighbors, leaf size |
| GPR | Length scale, alpha |
| SVM | Gamma, C |
| ANN | Neurons in hidden layer, learning rate |
| RF | Number of estimators, max depth |
| XGBoost | Number of estimators, learning rate, subsample, max depth |

Figure 4:
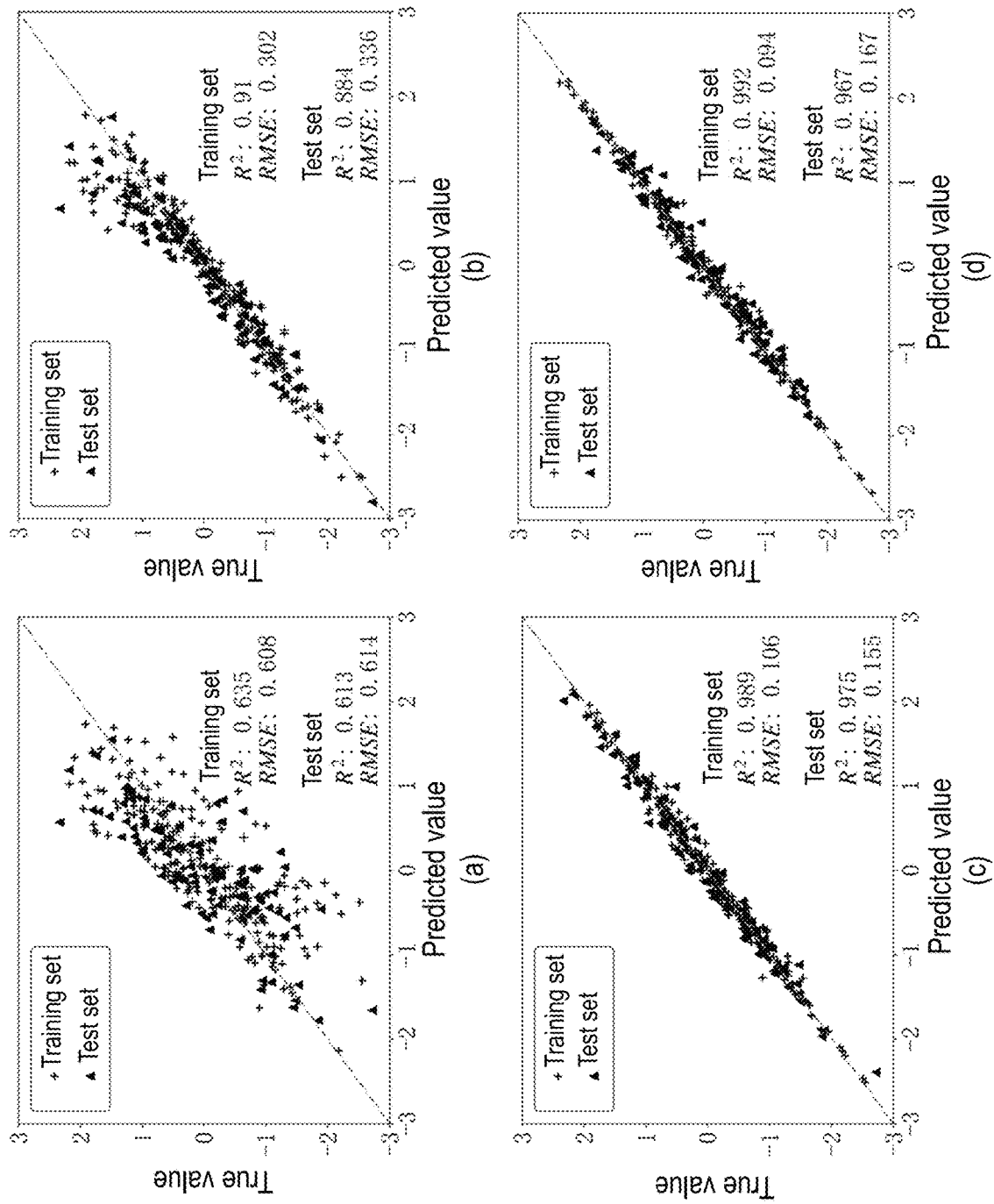
FIG. 4 is a comparison chart of the prediction performance of six machine learning models according to the invention.

In order to demonstrate the advantages of using the combination of optimal intensity measures as input for the machine learning model to predict the seismic damage response of a building, a common intensity measure PGA, a single optimal intensity measure Sa–1.0 s, a combination of optimal intensity measures and all candidate intensity measures are respectively used as input features to train a machine learning model. Taking an SVM model as an example, as shown in FIG. 4 ((a): PGA, (b): a single optimal intensity measure, (c): a combination of optimal intensity measures, and (d): candidate intensity measures), by comparing the prediction performance of the SVM model based on different ground motion intensity measures as input, it can be seen that the performance of the SVM model based on PGA is obviously lower than the performance of the model based on the optimal intensity measure Sa–1.0 s; then, with use of the combination of optimal intensity measures as input at the same time, the SVM model achieves the best performance; and when all candidate intensity measures are used as input at the same time, the performance of the SVM model drops significantly.

(7) Based on assessment measures for prediction model performance, determining optimal hyperparameters and corresponding machine learning models by grid search technique. In an embodiment, mean square error MSE is used as an assessment measure to determine the optimal hyperparameters of the machine learning model as follows:

$$MSE = \frac{1}{N}\sum_{i=1}^{N}(y_i - \hat{y}_i)^2$$

where y and ŷ are a true value and a predicted value, respectively.

the goodness of fit $R^2$ and the root mean square error RMSE of the test set are used to demonstrate the prediction performance of the machine learning models, wherein the RMSE is calculated by:

$$RMSE = \left(\frac{1}{N}\sum_{i=1}^{N}(y_i - \hat{y}_i)^2\right)^{1/2}$$

where y and ŷ are a true value and a predicted value, respectively.

Figure 5:
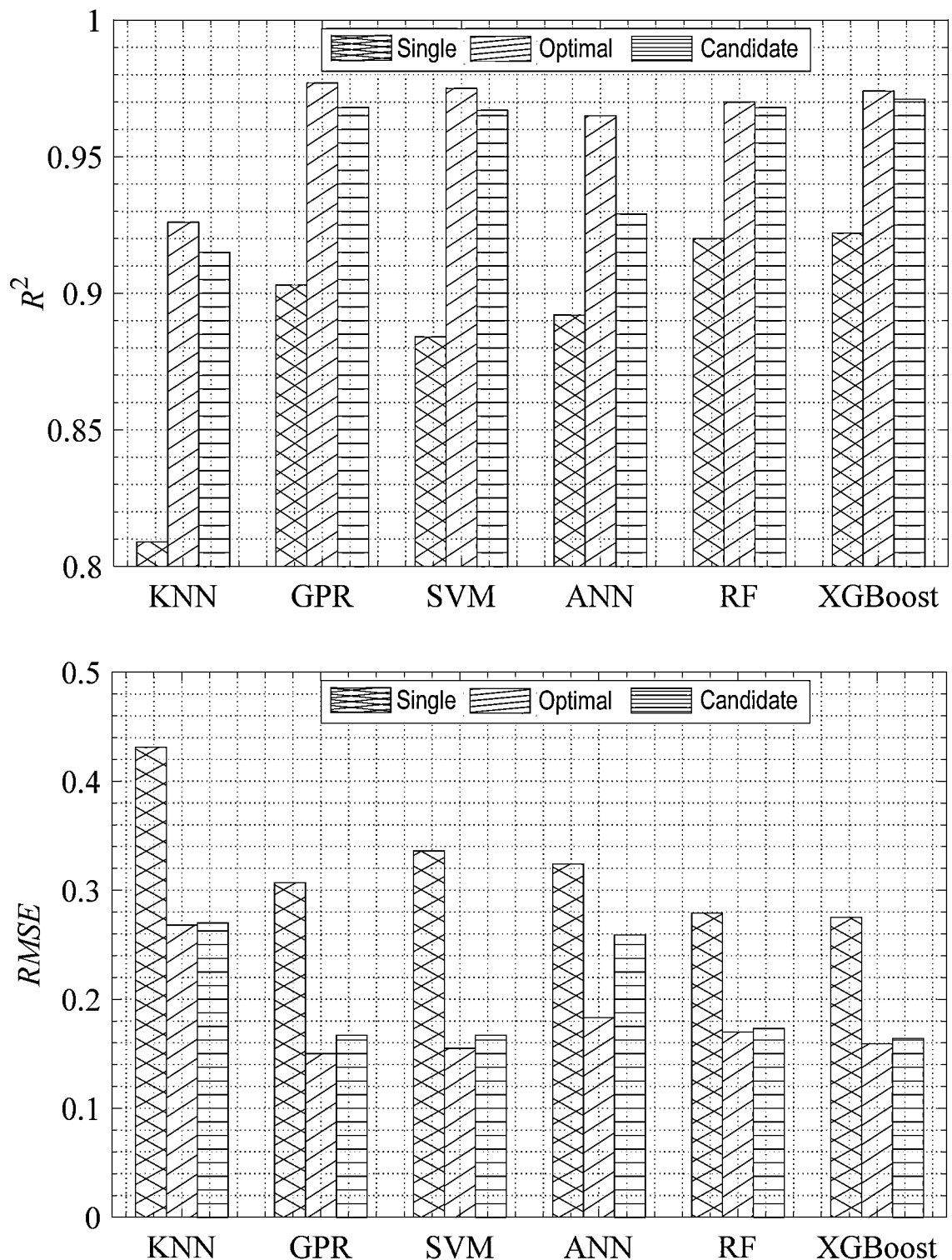
FIG. 5 is a comparison chart of the prediction performance of machine learning models based on different ground motion intensity measures as input samples according to the invention.

The goodness of fit ($R^2$) and root mean square error RMSE of six machine learning models on the test set are shown in FIG. 5. The comparison shows that all machine learning models based on a combination of optimal intensity measures are superior to the models based on a single optimal intensity measure and the models based on all candidate intensity measures. This result comes from the following reasons: comparing using a single intensity measure as input, using the combination of optimal intensity measures can comprehensively characterize the key characteristics of strong earthquakes, thereby significantly improving the prediction accuracy of the machine learning model; comparing using all candidate intensity measures as input, using the combination of optimal intensity measures can reduce the input dimension, thereby improving the training efficiency of the machine learning models.

(8) Rapidly predicting a structural damage state of the building under earthquake damage by means of the trained machine learning models. In an embodiment, by inputting the optimal ground motion intensity measures and basic information data of the building into the trained machine learning models, the maximum inter-story drift ratio of the target building can be quickly obtained. According to damage states thresholds recommended by the specification: 0-0.002 means no damage; 0.002-0.01 means slight damage; 0.01-0.02 means moderate damage; 0.02-0.04 means severe damage; and greater than 0.04 means complete collapse, the damage states of the building under given ground motion intensity measures can be assessed.

What is claimed is:

1. A ground motion intensity measure optimization method for seismic response prediction, wherein, comprising the following steps:
   (1) determining candidate intensity measures (IM) s by collection and sorting of literature, obtaining N actual ground motion records that meet site characteristics, and calculating the candidate intensity measures corresponding to each of the N actual ground motion record;
   (2) determining structural parameters SPs of a building and a probability distribution, and carrying out Latin Hypercube Sampling (LHS) to obtain N building samples that meet parameter distribution;
   (3) using an OpenSees software to establish N numerical models of the building corresponding to the N building samples and obtaining N damage measures (DM) s of the building over N intensity measures by means of a nonlinear time-history analysis to build a post-earthquake building damage database, wherein the post-earthquake building damage database is built by: using ground motion intensity measures and structural parameters of the building as input samples; and damage measures of the building as output examples;
   (4) constructing a variable selection model based on an elastic-net algorithm according to the post-earthquake building damage database, comprising:
   first, N ground motion intensity measures $x_{IMs} = [x_1, x_2, \ldots, x_n]$ in the post-earthquake building damage database are selected as input samples, where n is 28; the output samples are corresponding N damage measures $y_{DM}$;
   then, the post-earthquake building damage database is standardized and then randomly divided into a training set and a test set according to a P:Q ratio; the elastic-net algorithm is expressed as:

$$\hat{\beta} = \arg\min_{\beta}\left(\sum_{i=1}^{N}\left(y_i - \sum_{j=1}^{n}x_{ij}\beta_j\right)^2 + \alpha\lambda\sum_{j=1}^{n}|\beta_j| + \frac{(1-\alpha)}{2}\lambda\sum_{j=1}^{n}|\beta_j|^2\right)$$

where $\beta = [\beta_1, \beta_2, \ldots, \beta_n]$ refers to a regression coefficient; $\alpha \in [0, 1]$ refers to a hyperparameter; $\lambda$ refers to a non-negative regularization parameter; $x_{ij}$ is an element of one of the ground motion intensity measures; $y_i$ is one of the damage measures; $\alpha$ and $\lambda$ are determined by following criteria:
   (a) when $\alpha$ tends to 1, the elastic-net algorithm, similar to a Lasso algorithm, causes too many input features to be screened out, resulting in unstable models; and when $\alpha$ tends to 0, redundant input features are retained, resulting in a lack of selection efficiency;
   (b) when $\lambda$ is larger, more of the regression coefficients are reduced to 0, that is to be screened out;
   (5) calculating efficiency and practicality of the intensity measures by means of the elastic-net model, then selecting a combination of optimal intensity measures IMs*, and testing an adequacy of the intensity measures; the efficiency of one of the intensity measures is represented by a goodness of fit ($R^2$) of the elastic-net model, which is calculated by:

$$R^2 = 1 - \frac{\sum_{i=1}^{N}(y_i - \hat{y}_i)^2}{\sum_{i=1}^{N}\left(y_i - \frac{1}{N}\sum_{i=1}^{N}y_i\right)^2}$$

the practicality of one of the intensity measures is represented by a variable regression coefficient $\beta$ of the elastic-net model; the adequacy of one of the intensity measures is characterized according to a p-value of the intensity measures and seismic characteristics (i.e., seismic magnitude and seismic distance);
   (6) based on the post-earthquake building damage database, performing model training by means of a machine learning method; wherein the input samples of the post-earthquake building damage database are the optimal intensity measures IMs* and the structural parameters $x = [x_{IMs}*, x_{SPs}]$, the output samples are the damage measures $y_{DM}$; the post-earthquake building damage database is standardized and then randomly divided into the training set and the test set according to the P:Q ratio for training;
   (7) based on assessment measures for a prediction model performance, determining optimal hyperparameters and corresponding machine learning models by a grid search technique; and (8) rapidly predicting a structural damage state of the building under earthquake damage by means of trained machine learning models.

2. The ground motion intensity measure optimization method for seismic response prediction according to claim 1, wherein in the step (1), the candidate intensity measures are divided into structure-independent or structure-dependent related to acceleration, related to velocity, related to displacement, and related to time based on their physical definition; according to a fortification level, site condition and design characteristic period, the actual ground motion records that match a site-specific target response spectrum are obtained.

3. The ground motion intensity measure optimization method for seismic response prediction according to claim 1, wherein specifically in the step (2), there are 12 structural parameters (SP) s of the building in total, comprising: bulk density of concrete, compressive strength of core concrete, peak strain of core concrete, ultimate strain of core concrete, compressive strength of cover concrete, ultimate strain of cover concrete, diameter of steel bars in columns, diameter of a first steel bar in beams, diameter of a second steel bar in beams, yield strength of steel bars, elastic modulus of steel bars, and hardening rate of steel bars; parameters of the probability distribution comprise mean, variance and distribution type, and then 12 structural parameter variables are sampled respectively by means of LHS to generate N random number samples, which are finally combined into the N building samples.

4. The ground motion intensity measure optimization method for seismic response prediction according to claim 1, wherein in the step (3), the N numerical models of the building are randomly matched with the N actual ground motion records; the damage measures of the building refer to a maximum inter-story drift ratio.

5. The ground motion intensity measure optimization method for seismic response prediction according to claim 1, wherein the machine learning method in the step (6) comprises K nearest neighbor (KNN), Gaussian process regression (GPR), support vector machine (SVM), artificial neural network (ANN), random forest tree (RF) and extreme gradient boosting tree (XGBoost).

6. The ground motion intensity measure optimization method for seismic response prediction according to claim 1, wherein in the step (7), mean square error MSE is used as an assessment measure to determine the optimal hyperparameters of the machine learning models as follows:

$$MSE = \frac{1}{N}\sum_{i=1}^{N}(y_i - \hat{y}_i)^2$$

where y and $\hat{y}$ are a true value and a predicted value, respectively;

the goodness of fit $R^2$ and a root mean square error RMSE of the test set are used to demonstrate prediction performance of the machine learning model, wherein the RMSE is calculated by:

$$RMSE = \left(\frac{1}{N}\sum_{i=1}^{N}(y_i - \hat{y}_i)^2\right)^{1/2}$$

where y and $\hat{y}$ are the true value and the predicted value, respectively.

* * * * *